United States Patent
Mohaupt

(10) Patent No.: US 8,648,608 B2
(45) Date of Patent: *Feb. 11, 2014

(54) VLF TEST GENERATOR

(75) Inventor: Peter Mohaupt, Innsbruck (AT)

(73) Assignee: Mohaupt High Voltage GmbH, Mieders, Tirol (AT)

( * ) Notice: Subject to any disclaimer, the term of this patent is extended or adjusted under 35 U.S.C. 154(b) by 467 days.

This patent is subject to a terminal disclaimer.

(21) Appl. No.: 12/994,219

(22) PCT Filed: May 20, 2009

(86) PCT No.: PCT/AT2009/000211
§ 371 (c)(1),
(2), (4) Date: Nov. 23, 2010

(87) PCT Pub. No.: WO2009/143543
PCT Pub. Date: Dec. 3, 2009

(65) Prior Publication Data
US 2011/0068806 A1    Mar. 24, 2011

(30) Foreign Application Priority Data
May 28, 2008    (AT) .................................. A 856/2008

(51) Int. Cl.
*G01R 31/02*    (2006.01)

(52) U.S. Cl.
USPC .............................. 324/551; 324/541; 324/544

(58) Field of Classification Search
USPC .................. 324/508–537, 551, 555, 649–726
See application file for complete search history.

(56) References Cited

U.S. PATENT DOCUMENTS

| | | | |
|---|---|---|---|
| 5,059,893 A * | 10/1991 | Hiral et al. | 324/74 |
| 2001/0028542 A1* | 10/2001 | Kuperman et al. | 361/18 |
| 2010/0073008 A1* | 3/2010 | Twerdochlib | 324/520 |
| 2010/0118491 A1* | 5/2010 | Blank et al. | 361/695 |
| 2012/0306510 A1* | 12/2012 | White et al. | 324/551 |

FOREIGN PATENT DOCUMENTS

| | | | |
|---|---|---|---|
| DE | 3737373 A1 | * | 10/1988 |
| DE | 10206788 A1 | * | 8/2003 |
| DE | 10333241 | | 11/2004 |
| GB | 1008461 | | 10/1965 |

OTHER PUBLICATIONS

International Search Report from International Application No. PCT/AT2009/000211, issued May 28, 2010.
International Preliminary Report on Patentability issued Dec. 16, 2010 from related International Application No. PCT/AT2009/000211.

\* cited by examiner

*Primary Examiner* — Jermele M Hollington
*Assistant Examiner* — Adam Clarke
(74) *Attorney, Agent, or Firm* — Hoffmann & Baron, LLP

(57) ABSTRACT

Disclosed is a very low frequency test generator for generating a high voltage having a low frequency in order to test the insulation of capacitive loads, in particular power cables. Said VLF test generator comprises an oscillator part which generates a high voltage that has a high frequency and is modulated with a lower frequency at an output, and a demodulator which is connected to the oscillator part, demodulates the high voltage, and recovers the low frequency therefrom. A discharge resistor for the capacitive load is connected in parallel to the demodulator, said discharge resistor conducting back to the aforementioned output.

20 Claims, 4 Drawing Sheets

VLF TEST GENERATOR

CROSS-REFERENCE TO RELATED APPLICATIONS

This application is a National Phase application of International Application No. PCT/AT2009/000211 filed May 20, 2009 which claims priority to Austrian Patent Application No. A 856/2008 filed May 28, 2008.

BACKGROUND

The present invention relates to a VLF test generator for generating a high voltage with a low frequency for testing the insulation of capacitive loads, in particular power cables, having an oscillator part which generates at an output a high voltage which has a high frequency and is modulated with a low frequency, and a demodulator connected thereto for demodulating the high voltage and recovering the low frequency therefrom.

Testing with high voltages of a very low frequency (VLF) in the tenth of a hertz range is now established practice for power testing of the insulation of highly capacitive loads such as buried cable systems. Unlike mains frequency or higher frequency test voltages, VLF test voltages bring about only slight reactive power in the capacitive load, such that the test generator may be made correspondingly smaller; and, in comparison with previously used direct voltage tests, VLF test voltages prevent any build-up of harmful space charges and residual charges in the cable system, which on subsequent operation could result in dielectric breakdowns.

Generating suitable VLF test voltages in the high voltage range, i.e. of up to several hundred kilovolts, is however not in any way straightforward, as high voltage transformers are not feasible for such low frequencies. The most varied circuits have thus already been proposed for VLF test generators, but all of them either involve highly complex circuitry or have costly or fault-prone components.

DE 103 33 241 B, for example, discloses a VLF test generator of the initially stated type which uses a variable transformer with a motor-driven adjustment means in order to amplitude-modulate a mains frequency high voltage by periodic adjustment of the transformer. The amplitude-modulated high voltage is stepped up and then, with the assistance of a demodulator, the modulation frequency is recovered as a VLF high voltage. The demodulator is formed by a diode rectifier whose conducting-state direction can be changed over and which changes over at each half-wave of the low frequency in order to reverse the capacitive load with each half-wave. A switchable discharging resistor is connected in parallel to the capacitive load in order to assist the reversal. Such a load-parallel discharging resistor does however result in elevated power loss and/or requires additional switching electronics with correspondingly increased costs, weight and cooling requirements.

The object of the invention is to overcome the disadvantages of the known prior art and to provide a VLF test generator for the generation of low-frequency high voltages which can be produced simply and inexpensively, has a low weight for mobile, on-site use, has a low power loss and accordingly a low cooling capacity.

SUMMARY

This object is achieved with a VLF test generator of the above-stated kind which is distinguished according to the invention in that a discharging resistor for the capacitive load which leads back to the stated output is connected in parallel to the demodulator.

In comparison with conventional circuits with a permanent load-parallel discharging resistor, the circuit according to the invention has a substantially lower power loss; and in comparison with solutions with a switchable load-parallel discharging resistor, the solution according to the invention does not require a separate switch, because the discharging resistor related to the output potential of the resonant circuit always comes particularly strongly into effect when the interference product in the resonant circuit has its beat node and thus approaches zero potential. As a consequence, it is possible to make significant savings in costs, weight, power loss and cooling requirements.

Demodulation of the low frequency may be effected with any demodulator circuit known in the art. One solution which is particularly simple in circuit design terms is achieved, as is known per se from the cited document DE 103 33 241 B, if the demodulator co-uses the capacitive load and reverses the latter by means of a rectifier in step with the low frequency. In this case, a particularly advantageous embodiment of the invention involves simply connecting the discharging resistor in parallel to the rectifier.

Any rectifier circuit known in the art may also be used for the rectifier. It is particularly advantageous if, as is known per se from DE 103 33 241 B, the rectifier comprises two anti-parallel diode branches provided with switches, the switches alternately changing over between the diode branches. In this case, the discharging resistor may simply be connected in parallel to the two diode branches, which is a solution with minimal component requirements.

In a further preferred embodiment of the invention, each of the stated diode branches is formed by a chain of diodes and interposed semiconductor switches, an individual resistor being connected in parallel to each diode and each semiconductor switch, said individual resistors all jointly forming the stated discharging resistor. In this way, the number of components required may be still further reduced and an elevated electric strength achieved.

A further preferred feature of the invention provides that, on changeover, the switches are briefly closed simultaneously and overlappingly. In this way, the transient response of the generator output voltage on changeover of the rectifier can be minimised.

It is furthermore particularly advantageous if, according to a further feature of the invention, a control device is additionally provided for the oscillator part, which control device reduces the amplitude of the high voltage at the end of each second quarter of the period of the low frequency, in order to assist discharge of the capacitive load via the discharging resistor.

Any oscillator circuit known in the art may also be used for the oscillator part, which oscillator circuit is capable of generating a low-frequency modulated high voltage, for example electric motor driven variable transformers, as are known per se from DE 103 33 241 B. It is, however, particularly favourable if the oscillator part comprises two oscillators, the oscillator frequencies of which differ from one another by twice the stated low frequency, and a resonant circuit supplied interferingly by the oscillators which is tuned to the oscillator frequencies for voltage superelevation of the interfering oscillator frequencies, the demodulator outcoupling the low frequency generated by the interference from the resonant circuit and applying it to the load. At variance with all known solutions, this embodiment is based on the new approach of making use of the interference or beat between two slightly differing oscillators for generating a low-frequency modulation in a resonant circuit, which approach simultaneously brings about a voltage rise of the interference product. In this manner, an output voltage of very high amplitude and very low frequency can be generated with surprisingly few components. Fault-prone mechanical elements or complex power electronics with elevated cooling requirements are entirely unnecessary. Due to its low weight, space requirement and robustness, the VLF test generator according to the invention is particularly suitable for mobile use in on-site insulation testing, for example of buried power cables.

It is particularly favourable if, according to a further feature of the invention, the oscillators supply the resonant circuit via at least one transformer, whereby electrical isolation of the oscillators from the resonant and thus high voltage circuit may be achieved and negative repercussions on the oscillators of transient phenomena on the high voltage side may be prevented; furthermore, an inductive load for the oscillator outputs may be provided in this manner, as is required, for example, by the stated power modules.

One particularly advantageous embodiment of the invention is distinguished in that the transformers are simultaneously used to step up the oscillator output voltages for supply to the resonant circuit. A further increase in the output voltage of the VLF test generator may be achieved in this manner.

The voltage rise in the resonant circuit in particular also makes it possible to use conventional controllable semiconductor inverters for the oscillators, as are known in the form of "power modules" and are capable, for example, of generating any desired output voltage profiles of up to 400 V from a mains frequency supply voltage of 400 V; solely as a result of the voltage rise in the resonant circuit, it is possible to obtain therefrom output voltages in the range of a few tens of kV.

BRIEF DESCRIPTION OF THE DRAWINGS

The invention will be explained below with reference to an exemplary embodiment shown in the drawings, in which.

DETAILED DESCRIPTION

Figure 1:
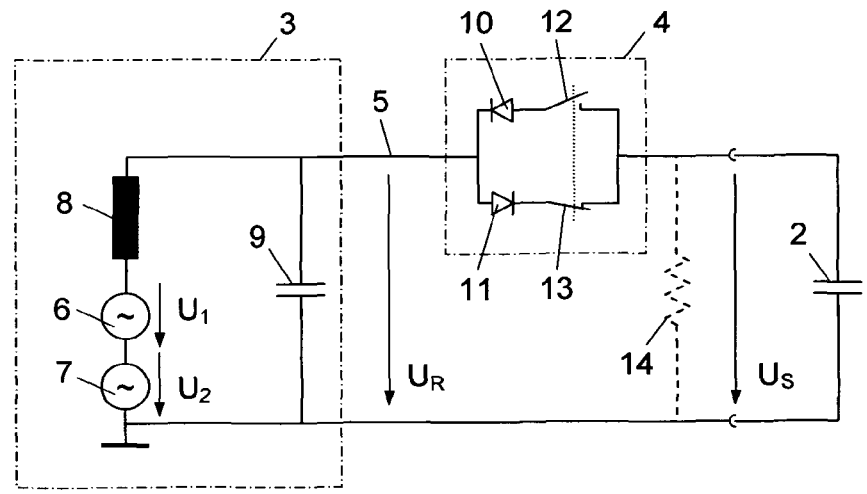
FIG. 1 is a circuit diagram of a first embodiment of a VLF test generator.

FIG. 1 shows a test generator 1 which generates a high voltage $U_S$ in the range from several tens to several hundred kV and with a very low frequency (VLF) in the range from a few hertz and below. The VLF test generator 1 serves to test the insulation of a capacitive load 2, for example an underground high voltage cable. Such loads 2 generally have a capacitance in the range of up to a few μF. The further measuring arrangement for testing the insulation of the load 2 after application of the low-frequency high voltage $U_S$, in particular for measuring the output voltage, for accompanying diagnostic measurements, such as dissipation factor measurements or partial discharge measurements etc., is not of relevance here and is not shown.

The test generator 1 is substantially composed of an oscillator part 3 and a demodulator 4 connected thereto. The oscillator part 3 generates at an output 5 a high voltage $U_R$ which has a relatively high frequency and is amplitude-modulated with the stated low frequency, and the demodulator 4 demodulates the modulation product $U_R$ in order to obtain therefrom a low-frequency high voltage $U_S$ as the generator output voltage and to apply it to the load 2.

As shown in FIG. 1, the oscillator part 3 comprises two oscillators 6, 7, the oscillator frequencies $f_1$, $f_2$ of which differ by twice the desired low frequency $f_S$ of the generator output voltage $U_S$, i.e. $f_2 - f_1 = 2f_S$. The oscillator frequencies $f_1$, $f_2$ are preferably substantially higher than the conventional mains frequency of electrical power distribution networks (50 or 60 Hz), specifically in general in the range from 100 Hz to 10 kHz, preferably in the range from 500 Hz to 5 kHz, and particularly preferably around 1 kHz, for example $f_S = 1000.0$ Hz and $f_2 = 1000.2$ Hz.

Figure 2:
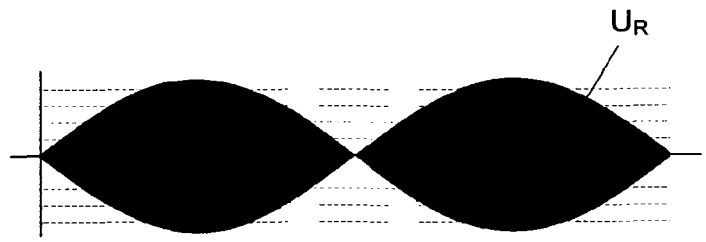
FIG. 2 shows the interference product, the resonance voltage $U_R$, which occurs in the resonant circuit.
Figure 3:
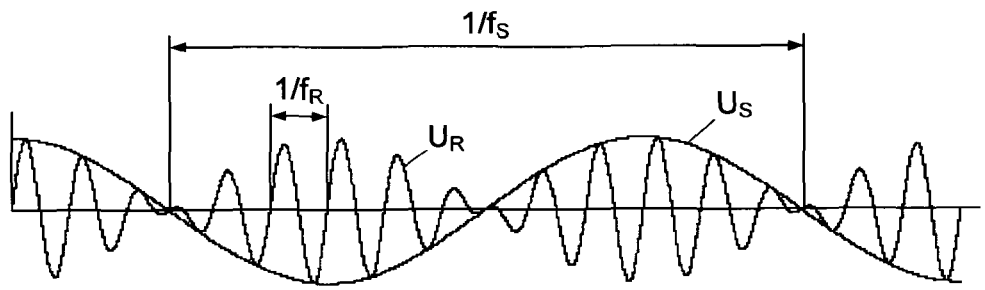
FIG. 3 shows the low-frequency modulation of resonance voltage $U_R$, magnified not-to-scale.

The oscillators 6, 7 jointly supply in series connection a resonant circuit formed by a choke 8 and a capacitor 9. Due to the mutual superposition or interference of the oscillator output voltages $U_1$, $U_2$, an interference product is established in the resonant circuit 8, 9 which may be regarded an oscillation of frequency $$f_R = \frac{f_1 + f_2}{2},$$

hereafter designated the resonance voltage $U_R$, which is amplitude-modulated with a low-frequency beat $U_S$ of frequency $$f_S = \frac{f_2 - f_1}{2},$$

as shown in FIGS. 2 and 3.

Since, in the stated example, $f_S = 0.1$ Hz, the 10,000 fold higher frequency resonance voltage $U_R$ is only visible in FIG. 2 as an area; for greater clarity, the resonance voltage $U_R$ is shown in FIG. 3 with a not-to-scale magnified period.

Due to the series connection of the oscillators 6, 7, the amplitude of the excitation voltage $U_1 + U_2$ of the resonant circuit 8, 9 is twice the amplitude of the individual oscillator output voltages $U_1$, $U_2$. The resonant circuit 8, 9 is tuned to the frequency $f_R$ of the excitation voltage $U_1 + U_2$, such that the resonance voltage $U_R$ at the resonant circuit is raised by the quality Q of the resonant circuit relative to the exciting oscillator voltages $U_1 + U_2$ and thus reaches 2·Q times one of the oscillator output voltages $U_1$, $U_2$.

The quality Q of the resonant circuit 8, 9 is preferably between 10 and 100, particularly preferably between 50 and 80. In this manner, due to the voltage interference and voltage rise in the event of resonance of the resonant circuit 8, 9, it is possible to generate a resonance voltage $U_R$ in the range from for example 60-80 kV from oscillator output voltages $U_1$, $U_2$ in the range from 3-400 V.

In order to outcouple the low-frequency high voltage $U_S$ from the resonant circuit 8, 9, the demodulator 4 shown here co-uses the load 2, specifically by reversing the latter via a switched rectifier 10-13 in step with the low frequency $f_S$. The demodulator 4 comprises for this purpose two antiparallel diode branches 10, 11, which, at each half-wave of the low frequency $f_S$, are alternately connected to the output 5 of the resonant circuit 8, 9 by means of corresponding switches 12, 13.

In order to prevent any jump in voltage as the generator output voltage $U_S$ passes through zero, this being brought about for example by voltage drops in the rectifier 10-13 and/or residual charges in the load 2, according to the prior art a discharging resistor 14 may be connected in parallel to the load 2. The discharging resistor 14 may be connected in parallel to the load 2 permanently or, with the assistance of a switch (not shown), only during the phase in which the output voltage $U_S$ is passing through zero.

Figure 4:
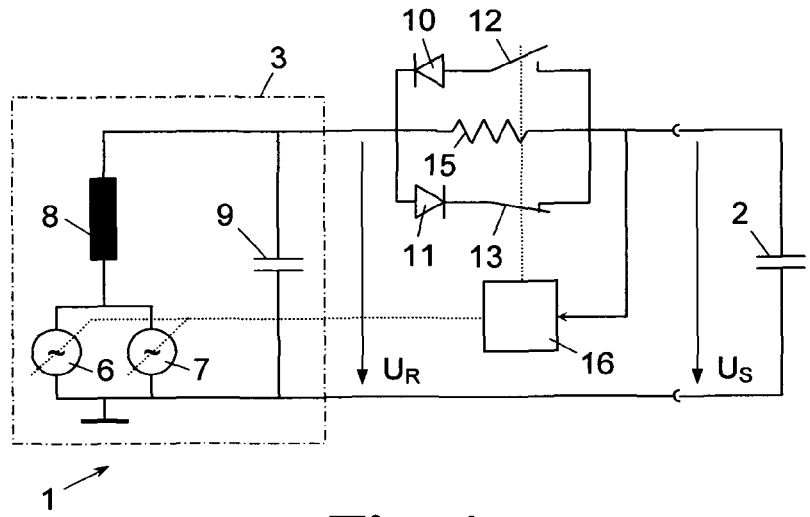
FIG. 4 is a circuit diagram of a second embodiment of a VLF test generator with the discharge circuit according to the invention.

Instead of such a (switchable) load-parallel discharging resistor 14 according to the prior art, which entails elevated power loss and/or additional switching electronics, the following discharge circuit according to FIG. 4 is used.

FIG. 4 shows an alternative embodiment of the VLF generator of FIG. 1, identical reference numerals denoting identical parts. As an alternative to FIG. 1, in this embodiment the two oscillators 6, 7 are connected in parallel to one another and interfere via their output currents, but the series connection of FIG. 1 may also be used.

In the embodiment of FIG. 4, a discharging resistor 15 is arranged in parallel to the demodulator 4 (or more precisely its switchable diode branches 10, 11) and discharges the load 2 towards the potential of the output 5 of the oscillator part 3. As a result, the discharging resistor 15 is particularly effective precisely during the phase when the output voltage $U_S$ is passing through zero, because at that point the output 5 is also tending towards zero due to the nodes of the resonant frequency $U_R$.

Figure 5:
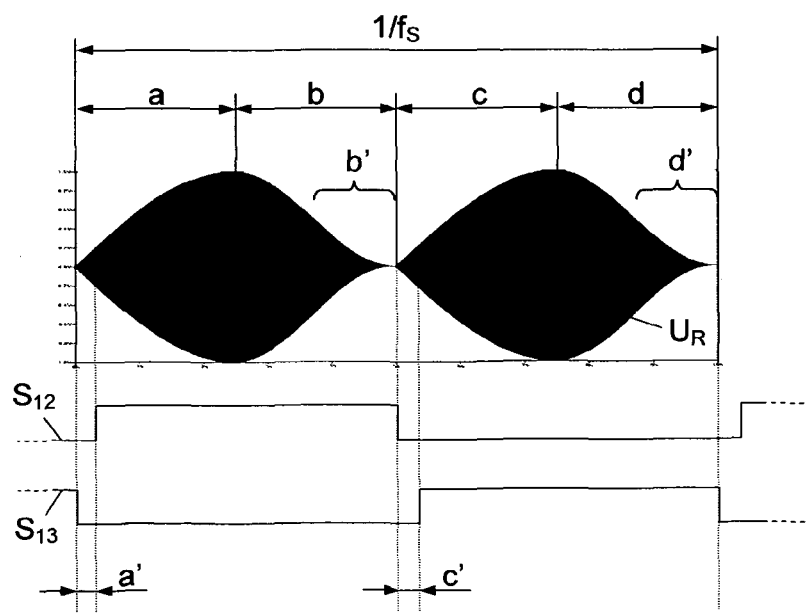
FIG. 5 shows downregulation of the oscillator output voltages in every second quarter period of the low frequency and switching profiles of the rectifier from FIG. 4 to assist load discharge.

According to FIG. 5, the effectiveness of the discharging resistor 15 may be increased in that, in the in each case second quarters b, d of the four quarters a-d of the period of the low frequency $f_S$, the output voltages $U_1$, $U_2$ of the oscillators 6, 7 are slightly reduced, specifically in particular in the final part b', d' of the quarters b, d, such that the envelope curve of the resonance voltage $U_R$ no longer has an exactly sinusoidal profile at that point. The actual time profile of this voltage reduction is here controlled with the assistance of a controller 16 which measures the generator output voltage $U_S$ in a feedback control circuit such that, taking account of the voltage drop in the diode branches 10, 11 and switches 12, 13 and the residual charges in the load 2, overall a maximally sinusoidal profile of the generator output voltage $U_S$ is obtained.

The discharging resistor 15 connected in parallel to the demodulator 4 results in a degree of crosstalk of the high frequency $f_R$ to the output frequency $f_S$. Appropriate dimensioning of the discharging resistor 15 and control of voltage reduction in zones b', d' can minimise this effect to such an extent that the degree of distortion or harmonic distortion of the generator output voltage $U_S$ is for example below 5% THD.

Discharge of the load 2 on changeover of the rectifier 10-13 may be further assisted by another measure. FIG. 5 shows the time profile of the switching schematics $S_{12}$, $S_{13}$ of the switch 12, 13. As may be seen, actuations $S_{12}$, $S_{13}$ of the switches 12, 13 during changeover may overlap slightly, specifically such that the switches 12, 13 are both simultaneously closed for a brief period (zones a', c') immediately after the resonance voltage $U_R$ has passed through zero. As a result, the transient response of the generator output voltage $U_S$ may be minimised on changeover of the rectifier 10-13 and thus a still better approximation to an ideal sinusoidal profile may be achieved.

In the example shown of a VLF period $1/f_S$ lasting 10 s, the closure overlap a', c' preferably amounts to approx. 0.1 s. In general, the closure overlap a', c' is in the range from a few thousandths to a few hundredths of $1/f_S$.

Figure 6:
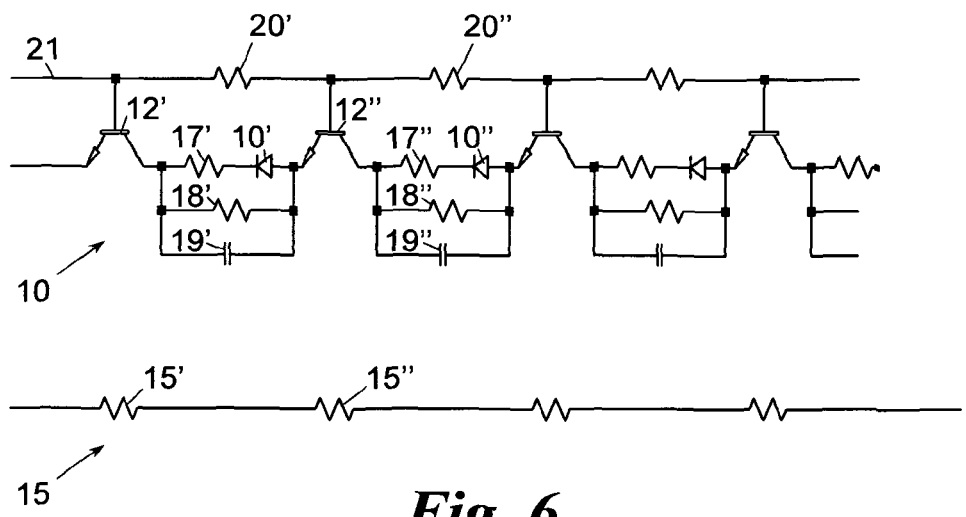
FIGS. 6 and 7 show two alternative embodiments for the diode branches of the rectifier and the discharging resistor of FIG. 4.

FIG. 6 shows a first practical embodiment of the diode branch 10 and the discharging resistor 15 (diode branch 11 is a mirror image). As is known in high voltage engineering, the diode branch 10 is preferably formed by a chain of individual diodes 10', 10" etc. and interposed individual semiconductor switches 12', 12" etc. Each diode 10', 10" is interconnected with a serial current-limiting resistor 17', 17" etc., a parallel testing resistor 18', 18" etc. and a parallel protection capacitor 19', 19" etc.

Actuation of the semiconductor switches 12', 12" is schematically symbolised by a control line 21 provided with resistors 20', 20" etc., via which line the switching signal $S_{12}$ is supplied; the actual actuation circuits for the semiconductor switches 12', 12" are known to a person skilled in the art and are not shown in greater detail here. In order to increase electric strength, the discharging resistor 15 is made up of series-connected individual resistors 15', 15" etc.

Figure 7:
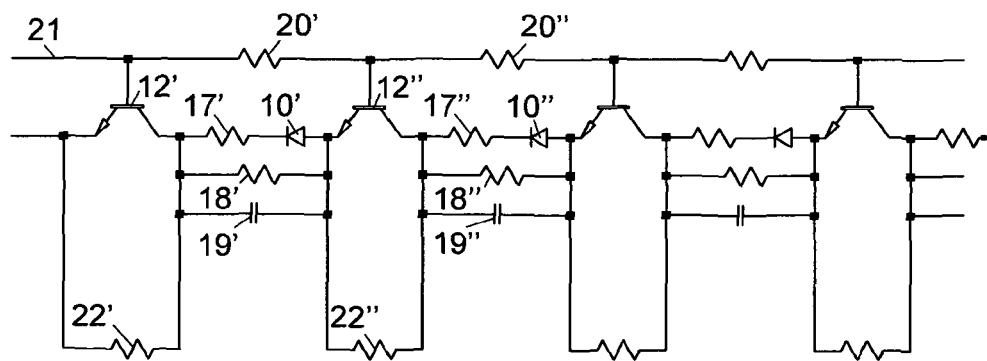

As shown in FIG. 7, the parallel testing resistors 18', 18" of the diodes 10', 10" may be co-used to form the discharging resistor 15. For this purpose, resistors 22', 22" etc. are connected in parallel to the semiconductor switches 12', 12", which resistors, together with the testing resistors 18', 18" and the resistor chain located parallel thereto of the mirror image diode branch 11 (not shown), form the discharging resistor 15.

Figure 8:
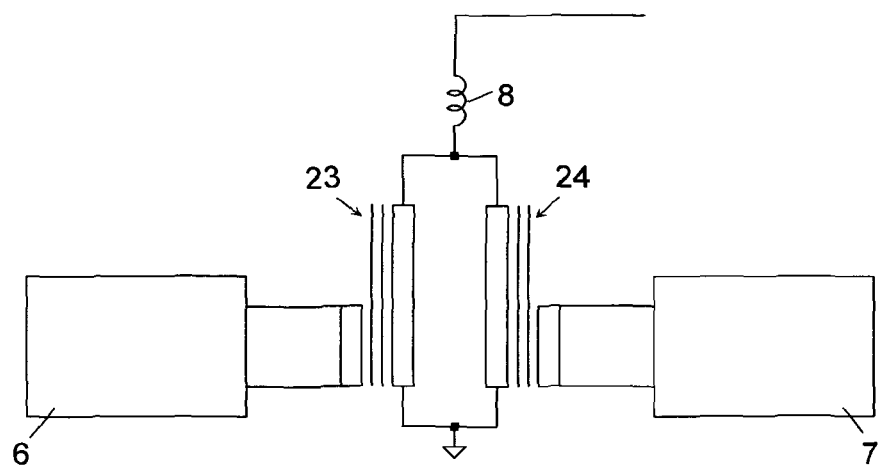
FIGS. 8 to 10 show alternative circuit variants for connecting the oscillators to the resonant circuit.
Figure 9:
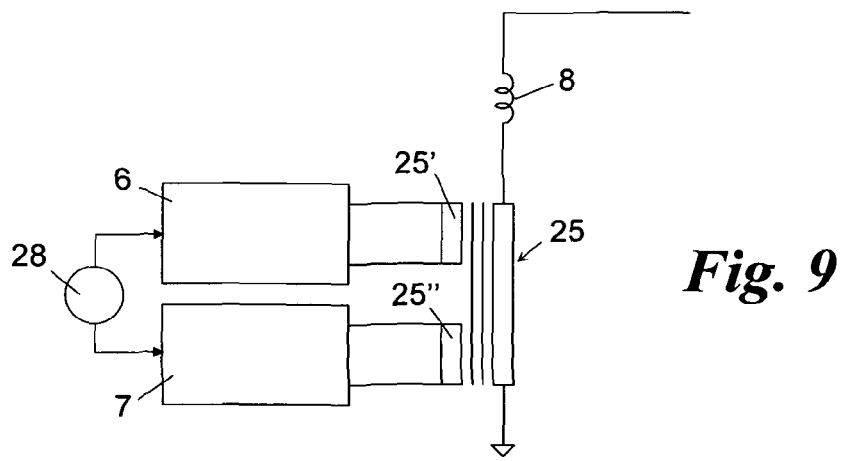
Figure 10:
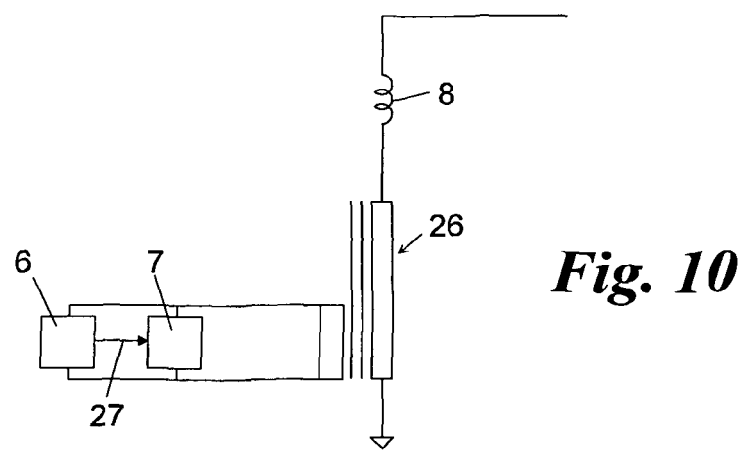

FIGS. 8 to 10 show various practical embodiments of the oscillators 6, 7 and their connection to the resonant circuit 8, 9 (shown only in part). The oscillators 6, 7 are here in each case formed by semiconductor inverters, the output voltages of which may be adjusted by microprocessor control to any desired frequency or amplitude ("power modules").

In the embodiment of FIG. 8, each oscillator 6, 7 supplies the resonant circuit 8, 9 via a dedicated high voltage transformer 23, 24. The transformers 23, 24 serve various purposes: for electrical isolation of the oscillators 6, 7 from the resonant circuit 8, 9; for electrical isolation from one another, for providing an inductive load for the oscillators 6, 7; and for additional stepping up of the oscillator output voltages $U_1$, $U_2$ for excitation of the resonant circuits 8, 9. For example, oscillator output voltages $U_1$, $U_2$ of approx. 400 V may be stepped up therewith to a resonant circuit excitation voltage of approx. 4 kV, such that a generator output voltage $U_S$ of approx. 400 kV may be achieved with a resonant circuit of quality Q=100.

In the embodiment of FIG. 9, the two oscillators 6, 7 share a common transformer 25, each oscillator supplying a dedicated primary winding 25', 25" of the transformer 25, which are arranged in series on the transformer core, such that here too voltage interference of the oscillator output voltages $U_1$, $U_2$ is obtained.

FIG. 10 finally shows a further embodiment in which a single high voltage transformer 26 is used, to the primary winding of which are connected the oscillators 6, 7 in galvanic parallel connection (or series connection, not shown), such that interference of the oscillators here proceeds by current interference (or voltage interference, not shown) in the primary circuit.

As symbolised by the arrow 27 in FIG. 10, the oscillator frequency $f_2$ of the one oscillator 7 may be derived from the oscillator frequency $f_1$ of the other oscillator 6, whereby elevated constancy of the beat frequency $f_S=(f_2-f_1)/2$ may be achieved. Alternatively, the oscillator frequencies $f_1$, $f_2$ of the oscillators 6, 7 may also be derived from a common clock generator 28, see FIG. 9.

If no particularly high output voltage $U_S$ is required, the voltage-transforming high voltage transformers 23-26 may also be replaced by matching transformers for impedance matching and electrical isolation.

The invention is not limited to the embodiments shown but instead encompasses all variants and modifications, in particular any desired combinations of the exemplary embodiments shown, which fall within the scope of the appended claims,

What is claimed is:

1. A very low frequency (VLF) test generator for generating a high voltage with a low frequency for testing the insulation of capacitive loads comprising an oscillator which generates at an output a high voltage which has a high frequency and is modulated with a low frequency a demodulator connected to the oscillator for demodulating the high voltage and recovering the low frequency therefrom; and a discharging resistor for discharging the capacitive load towards the potential of said output of the oscillator, the discharging resistor being connected in parallel to the demodulator to thereby smooth the recovered low frequency voltage.

2. The VLF test generator according to claim 1 wherein the demodulator co-uses the capacitive load and reverses the latter by means of a rectifier in step with the low frequency, and further wherein the discharging resistor is connected in parallel to the rectifier.

3. The VLF test generator according to claim 2, wherein the rectifier comprises two antiparallel diode branches provided with switches, the switches alternately changing over between the diode branches, and further wherein the discharging resistor is connected in parallel to the two diode branches.

4. The VLF test generator according to claim 3, wherein each diode branch is formed by a chain of diodes and interposed semiconductor switches, a resistor being connected in parallel to each diode and each semiconductor switch, said resistors jointly forming the said discharging resistor.

5. The VLF test generator according to claim 3, wherein on changeover, the switches are briefly closed simultaneously and overlappingly.

6. The VLF test generator according to claim 1, wherein a control device is provided for the oscillator, which control device reduces the amplitude of the high voltage at the end of each second quarter of the period of the low frequency in order to assist discharge of the capacitive load via the discharging resistor.

7. The VLF test generator according to claim 1, wherein the oscillator comprises two oscillators, the oscillator frequencies of which differ from one another by twice the stated low frequency, and a resonant circuit supplied interferingly by the oscillators, which is tuned to the oscillator frequencies for voltage superelevation of the interfering oscillator frequencies, the demodulator outcoupling the low frequency generated by the interference from the resonant circuit and applying it to the load.

8. The VLF test generator according to claim 7 wherein the oscillators supply the resonant circuit via at least one transformer.

9. The VLF test generator according to claim 8, wherein the transformer steps up the oscillator output voltages.

10. The VLF test generator according to claim 7, wherein each oscillator is formed by a controllable semiconductor inverter.

11. A very low frequency (VLF) test generator for generating a high voltage with a low frequency for testing the insulation of a capacitive load, comprising:

an oscillator having a first and a second oscillator output and configured to generate, between the first and the second oscillator output, a high voltage which has a high frequency and is modulated with a low frequency;

a demodulator having a demodulator input and a demodulator output, the demodulator input being connected to the first oscillator output, the demodulator being configured to demodulate the high voltage and obtain therefrom, between the demodulator output and the second oscillator output, a low frequency high voltage; and a discharging resistor connected between the first oscillator output and the demodulator output to smooth the low frequency high voltage.

12. The VLF test generator according to claim 11 wherein the demodulator co-uses the capacitive load and reverses the latter by means of a rectifier in step with the low frequency, and further wherein the discharging resistor is connected in parallel to the rectifier.

13. The VLF test generator according to claim 12, wherein the rectifier comprises two antiparallel diode branches provided with switches, the switches alternately changing over between the diode branches, and further wherein the discharging resistor is connected in parallel to the two diode branches.

14. The VLF test generator according to claim 13, wherein each diode branch is formed by a chain of diodes and interposed semiconductor switches, a resistor being connected in parallel to each diode and each semiconductor switch, said resistors jointly forming the said discharging resistor.

15. The VLF test generator according to claim 13, wherein on changeover, the switches are briefly closed simultaneously and overlappingly.

16. The VLF test generator according to claim 11, wherein a control device is provided for the oscillator, which control device reduces the amplitude of the high voltage at the end of each second quarter of the period of the low frequency in order to assist discharge of the capacitive load via the discharging resistor.

17. The VLF test generator according to claim 11, wherein the oscillator comprises two oscillators, the oscillator frequencies of which differ from one another by twice the stated low frequency, and a resonant circuit supplied interferingly by the oscillators, which is tuned to the oscillator frequencies for voltage superelevation of the interfering oscillator frequencies, the demodulator outcoupling the low frequency generated by the interference from the resonant circuit and applying it to the load.

18. The VLF test generator according to claim 17 wherein the oscillators supply the resonant circuit via at least one transformer.

19. The VLF test generator according to claim 18, wherein the transformer steps up the oscillator output voltages.

20. The VLF test generator according to claim 17, wherein each oscillator is formed by a controllable semiconductor inverter.

* * * * *